(12) United States Patent
Victor et al.

(10) Patent No.: US 6,605,483 B2
(45) Date of Patent: Aug. 12, 2003

(54) SCREEN PRINTING LIGHT-EMITTING POLYMER PATTERNED DEVICES

(75) Inventors: John G. Victor, Grass Valley, CA (US); Matthew Wilkinson, Santa Cruz, CA (US); Sue Carter, Santa Cruz, CA (US)

(73) Assignee: Add-Vision, Inc., Scotts Valley, CA (US)

(*) Notice: Subject to any disclaimer, the term of this patent is extended or adjusted under 35 U.S.C. 154(b) by 0 days.

(21) Appl. No.: 09/844,703

(22) Filed: Apr. 27, 2001

(65) Prior Publication Data

US 2002/0013013 A1 Jan. 31, 2002

Related U.S. Application Data

(60) Provisional application No. 60/199,942, filed on Apr. 27, 2000.

(51) Int. Cl.[7] ............... H01L 21/00; H05B 33/02; H01J 1/62
(52) U.S. Cl. ............... 438/22; 438/69; 313/506
(58) Field of Search ............... 438/73; 430/200, 430/22, 29, 69, 99; 313/506

(56) References Cited

U.S. PATENT DOCUMENTS

| | | | | |
|---|---|---|---|---|
| 4,950,571 A | * | 8/1990 | Hotomi et al. | 430/58.1 |
| 5,133,988 A | | 7/1992 | Nire et al. | 427/66 |
| 5,371,327 A | | 12/1994 | Fujinami et al. | 174/257 |
| 5,408,109 A | * | 4/1995 | Heeger et al. | 257/40 |
| 5,798,170 A | | 8/1998 | Zhang et al. | 428/212 |
| 5,869,350 A | | 2/1999 | Heeger et al. | 438/29 |
| 5,909,081 A | | 6/1999 | Eida et al. | 313/504 |
| 5,945,225 A | | 8/1999 | Speith-Herfurth et al. | 428/516 |
| 5,976,613 A | | 11/1999 | Janusauskas | 427/66 |
| 5,998,803 A | | 12/1999 | Forrest et al. | 257/40 |
| 6,162,490 A | * | 12/2000 | Graves et al. | 427/71 |
| 6,252,253 B1 | * | 6/2001 | Bao et al. | 257/103 |
| 2001/0033135 A1 | * | 10/2001 | Duggal et al. | 313/506 |
| 2001/0035716 A1 | * | 11/2001 | Murasko | 313/510 |
| 2002/0098377 A1 | * | 7/2002 | Cao et al. | 428/690 |
| 2002/0190661 A1 | * | 12/2002 | Duggal et al. | 315/169.1 |

OTHER PUBLICATIONS

Itano, et al., "Fabrication and Performance of a Double-Layer Organic Electroluminescent Device Using a Novel Starburst Molecule, 1,3,5–Tris[N–(4–diphenylaminophenyl)phenylamino]benzene, as a Hole–Transport Material and Tris(8–quinolinolato) continued aluminum as an Emitting Material" IEEE, Transactions on Electron Devices, vol. 44, No. 8, Aug., 1997, p. 1218–1221.*

Dina A. Pardo, Ghassan E. Jabbour, and Nasser Peyghambarian, "*Application of Screen Printing in the Fabrication of Organic Light–Emitting Devices*", Adv. Mater, Sep. 1, 2000, vol. 17, pp. 1249–1252.

Toshiyuki Wtanabe, Hari Singh Nalwa and Seizo Miyata, "*Novel Fabrication Techniques of Electroluminescent and Photoluminescent Devices*", Organic Electroluminescnent Materials and Devices, 1997, pp. 459–482.

(List continued on next page.)

*Primary Examiner*—William David Coleman
(74) *Attorney, Agent, or Firm*—Pillsbury Winthrop LLP

(57) ABSTRACT

Described is a process for manufacturing a light emitting polymer device comprising, in one embodiment, the steps of providing a transparent or non-transparent electrode-containing substrate adapted to act as a first electrode, screen printing a light emitting polymer layer, which is composed of a light emitting polymer dissolved in a solvent, onto the hole injection layer and screen printing a hole injection layer onto the transparent electrode-containing substrate on one side of the light emitting polymer layer.

51 Claims, 7 Drawing Sheets

OTHER PUBLICATIONS

Jayesh Bharathan and Yang Yang, "*Polymer electroluminescent devices processed by inkjet printing: I. Polymer light-emitting logo*" American Institute of Physics, May 1998, vol. 72, No. 21, pp. 2660–2662.

Zhenan Bao, John A. Rogers and Howard E. Katz, "*Printable Organic and Polymeric Semiconducting Materials and Devices*", Journal of Materials and Chemistry, 1999, pp. 1895–1904.

\* cited by examiner

SCREEN PRINTING LIGHT-EMITTING POLYMER PATTERNED DEVICES

This application claims priority from U.S. provisional patent application 60/199,942 filed Apr. 27, 2000.

FIELD OF THE INVENTION

The invention disclosed in this patent is a process for making electroluminescent devices with light-emitting polymers by screen printing. The process allows creation of patterns of varying size that can illuminate with varying degrees of brightness, either all at once or at different times to create an animated display.

BACKGROUND OF THE INVENTION

In the late 1970's, pioneering work showed that conjugated polymers, those systems consisting of alternating single and double bonds, could conduct charges and be effectively utilized as both semiconductors and conductors. The charge transport mechanism in polymers is due to the weak overlap of p-orbitals along the backbone of conjugated chains. Charge carriers that are introduced by injection or doping can be delocalized when traveling in these orbitals, or $\pi$ bonds, allowing for the effective conduction of electricity. Because polymers can be made semiconducting, they exhibit the similar properties to inorganic semiconductors, such as photoluminescence, electroluminescence, and photoconductivity. In electroluminescence, injected charged carriers of opposite sign (i.e. electrons and holes) can recombine to emit radiative light. In the radiative recombination process, the electron drops from a higher energy orbital down to the lower energy orbital emitting a photon with energy equal to the difference in the upper and lower energy levels. For most conjugated polymers, this difference in energy levels results in light emission in the visible energy spectrum. As such, conjugated polymers can be used to make light emitting devices that emit in the blue, green and red. The most efficient light emitting structure is normally a diode, or LED, since this enables efficient balanced injection of the charge carriers.

Although there was early optimism that conduction in polymers would lead to new technologies, it was not until 1990 and the discovery of efficient electroluminescence at low voltages in thin films of conjugated polymer materials, and shortly after in liquid soluble conjugated polymers, that the promise of semiconducting polymer electronics, and LEDs, started to be widely embraced. This research demonstrated the importance of using thin films to achieve high current densities, and subsequently high light output, at low voltages. Such thin films were needed in order to overcome the low mobilities of conjugated organics that is caused by the inherent disorder and the weak overlap of the $\pi$-orbitals. The electron and hole mobilities have recently been measured in a conjugated polymer as a function of temperature with the result that both electron and holes undergo space charge limited behavior with a current density $J \sim \mu(T,V) V^2/L^3$, where the mobility $\mu(T,V)$ is exponentially dependent on field and temperature, V is the applied voltage and L is the length of the conduction path through the polymer. This type of transport appears now to be widely seen in conjugated polymer semiconductors and emphasizes that the current is dramatically reduced with increased length of the conduction path. For example, a factor of 100 increase in conduction path length can result in a minimum six order of magnitude decrease in current density.

Once the need for thin film materials was realized, polymer semiconductors offered promise of a complete paradigm shift in the manufacture of semiconducting devices since they enable inexpensive liquid-based processing under atmospheric conditions rather than expensive high temperature and vacuum-based processing. This promise motivated significant progress in polymer material development, purity and stability over the last decade. The realization that the incorporation of charge transporting layers into the polymer device could greatly improved device efficiency and stability further aided the rapid development of the science and technology. Now, a decade after the initial discovery of electroluminescence in polymers, polymer light emitting diodes are competitive in efficiency and stability to many inorganic-based devices and are now on the brink of commercialization. However, despite this apparent success, the initial promise, that of inexpensive liquid-based processing, has yet to fulfilled.

SUMMARY OF THE INVENTION

This invention aims to fulfill the of light emitting polymer devices promise by describing a method to inexpensively manufacture liquid processible polymer-based thin film light emitting devices using a screen printing based manufacturing process.

Although large area applications such as LEP wallpaper to replace incandescent and fluorescent wall lamps have been suggested, the only practical (i.e., reasonably cost-effective) methods for applying the necessary thin, uniform thickness light-emitting polymer layers to large areas are spin coating, ink jet printing and screen printing.

Spin coating, while capable of achieving thin, uniform thickness layers, does not allow layers to be deposited as patterns independent of substrate shape, a critical aspect of this Invention. Furthermore, spin coating is not suited for surfaces much larger than 14"×14" and is relatively slow, in terms of number of layers produced over a period of time.

Ink jet printing of LEP's has been demonstrated for relatively small displays and could conceptually be applied to larger area patterned devices.

Screen printing of organic semiconductors and LEP "light conversion layers" has been described but not for printing a LEP emissive layer, again a critical aspect of this invention.

BRIEF DESCRIPTION OF THE DRAWINGS

The invention will be better understood by reference to the following figures and description.

DETAILED DESCRIPTION OF THE INVENTION

Figure 1:
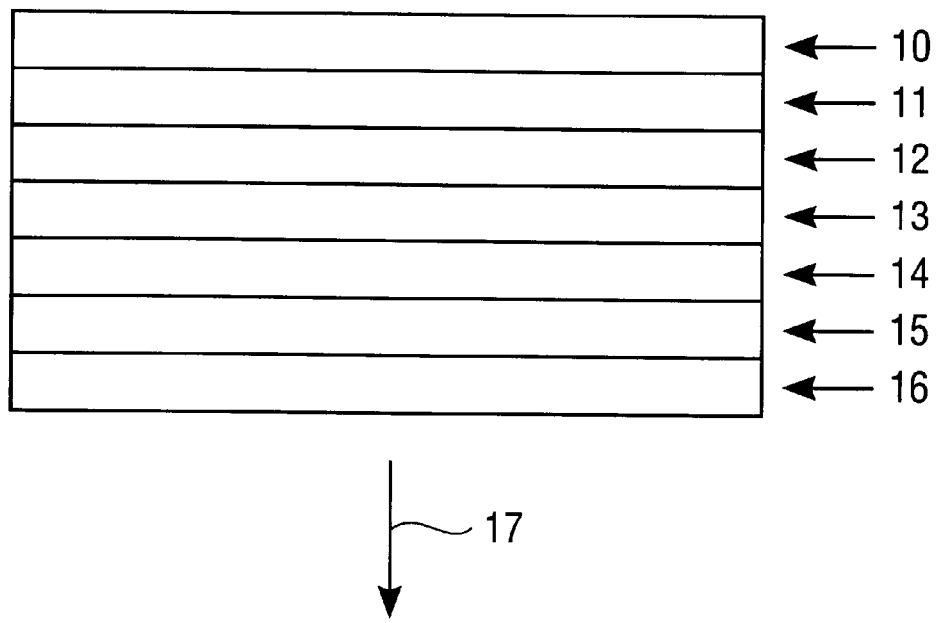
FIG. 1 shows a forward-build LEP device structure capable of fabrication by one embodiment of the method of the present invention.
Figure 2:
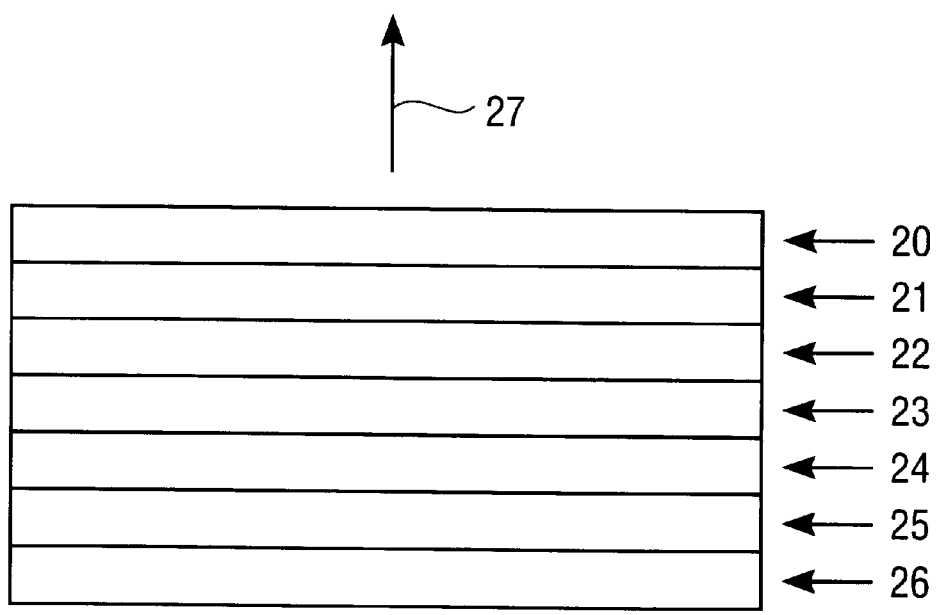
FIG. 2 shows a reverse-build LEP device structure capable of fabrication by one embodiment of the method of the present invention.

FIG. 1 shows one embodiment of a product produced by the process described in the present application. In this embodiment cathode, 10, electron transport layer, 11, emission layer, 12, hole transport layer, 13, hole injection layer, 14, transparent anode, 15 are printed onto substrate 16. The direction of light is shown as 17. FIG. 2 shows an embodiment in which the lamp is reverse build. Transparent anode, 20, hole injection layer, 21, hole transport layer, 22, emission layer, 23, electron transport layer, 24, cathode, 25 are printed on substrate 26. The direction of light is shown as 27.

Screen Printing

The essential components of a screen printing process consist of a cloth (sometimes termed "mesh") of interwoven threads, stretched tightly in a frame; a method of creating a patterned mask on the cloth to create areas that no ink can pass through; an ink, formulated to enable it to pool on the top of the cloth; a squeegee, a straight length of semi-rigid rubber attached to a handle, longer than the pattern being printed; and a substrate onto which the ink is to be printed through the pattern.

A patterned mask is prepared on the stretched cloth in the frame. Ink is poured onto the top surface of the cloth. A substrate onto which the ink is to be printed is placed underneath the framed cloth so that it does not directly contact the bottom surface of the cloth. A floodbar (which may be the squeegee) spreads the ink lightly over the patterned open cloth area without pressing down on the substrate. This fills the openings in the cloth with ink. Then the squeegee presses the cloth from the top against a substrate underneath and by sliding horizontally over the surface, squeezes out the ink in the open cloth areas onto the substrate, leaving the printed pattern. This can be repeated many times by replacing the substrate and printing anew. If the ink is properly formulated the printed image, once dried, firmly adheres to the substrate.

A variety of cloth types is available. Polyester is common; nylon cloth and metal cloth are also made. The specific limits we have found to our process apply to polyester cloth; however, nylon and metal cloth will give essentially similar results.

There are two broad classifications of weave widely used for the threads in the cloth: plain and twill. With plain weave, each thread is interwoven with every other, alternating as one thread above, the next thread below. With twill weave, as many as three threads alternate with as many as three other threads in the above, below interwoven pattern. A pressing process called calendering is commonly employed that reduces the fabric thickness. The end user typically purchases the type of cloth desired with no further modification necessary.

The specific limits which apply to make best use of the present invention have been found to apply to plain weave cloth; however various twill weaves would give substantially similar results.

The following is a description of commonly available screen parameters necessary for understanding the process limitations.

The percent open area is the percentage of all mesh openings in relation to the total mesh area.

The nominal thread diameter is the diameter of the thread used in the cloth prior to weaving, typically reported in microns. Related to this is the mesh opening, typically reported in microns, the space between one thread in the weave and the next.

Mesh count is the number of threads per inch in the cloth. This is sometimes given as number of threads per centimeter.

The fabric thickness is the thickness of the cloth in an unstretched condition, typically reported in microns.

The Theoretical Ink Volume is the volume of ink in all mesh openings per unit area of substrate, calculated as: % open area×fabric thickness. It is typically reported in microns, or as the equivalent $cm^3/m^2$. This "volume" is the thickness of the ink deposit as if the ink were coating the substrate below the open cloth as a uniform, continuous layer. It is not the actual ink thickness, but may be close.

A high tension is maintained on the cloth to keep it from sagging in the screen. A higher mesh count cloth gives both higher print definition and lower theoretical ink volume, but the mesh opening and % open area decrease. In general, the printed layers of light-emitting polymer lamp construction need to be as thin as possible which entails using higher mesh count screens with lower theoretical ink volume values.

Screen Printing the Hole Injection Layer

In the most common embodiment, a forward-build LEP construction, a hole injection layer is printed on an indium tin-oxide or other high work function transparent electrode adhering to a flexible or rigid substrate such as poly(ethylene terephthalate) or simple glass. This hole injection layer enhances the device operation, as taught in several patents. It consists of a conductive polymer, such as poly(ethylene dioxythiophene) [PEDOT] or polyaniline [PAni].

Contrary to prior art teachings with spin cast LEP, conductive indium tin oxide alone causes screen printed polymer electroluminescent lamps to light at voltages as much as 5 V higher than without an additional conductive polymer hole injection layer. We have found that this layer must be physically uniform at a size scale of about 20 nm; optically transparent, which limits its useful thickness to a few hundred nanometers; and smooth, since asperities on the order of a few tens of nanometers affect the quality of emitted light by causing bright spots. We further note that the hole injection layer may be the only patterned layer yet the lighted image will display that pattern. This is likewise true of the transparent conductive anode, polymer emitting layer and top electrode. Our process does not require surface preparation of the transparent electrode onto which the hole injection layer is printed, other than wiping clean of dust with residue-less solvent such as ethyl alcohol or isopropanol. However, we recognize that surface cleaning techniques such as plasma etching or more vigorous solvent cleaning may well improve device performance.

A limiting relation exists between theoretical ink volume and the hole injection layer ink's conductive polymer content, viscosity and surface tension that allow printing of a uniform hole injection layer. Further, this printing can be done at normal ambient conditions (20–50% relative humidity, ~21° C.).

Regardless of the solvent carrier, the surface tension of all conductive polymers used as hole injection layers is high (60–80 dynes/cm or higher) in contrast with the surface tension of the transparent conductor surface onto which they are printed. These polymers do not dissolve, but rather disperse as very small aggregates in carrier solvents suitable for screen printing. Conductive polymer inks for hole injection layers are either aqueous or non-aqueous.

For aqueous conductive polymer inks it is necessary to use a cloth with mesh count less than 305/inch, having theoretical ink volume greater than 14 microns, to deposit a uniform layer 200–400 nm thick, if the ink has 1–2 weight % conductive polymer content, and no other depositable solids. By simply multiplying the theoretical ink volume by the depositable solids volume fraction, a layer thickness can be calculated which is slightly less than that actually found.

Attempting to print aqueous conductive polymer inks with a higher mesh count screen but similar theoretical ink volume as the values described leads to excessive plugging of the screen, which necessitates frequent screen cleaning and excessive production downtime.

Attempting to print aqueous conductive polymer inks with a mesh having lower theoretical ink volume than the value described, to achieve a thinner layer, will instead give a non-uniform hole injection layer. This is because as the deposited layer shrinks during drying, local adhesion of the conductive polymer to the transparent electrode surface overcomes its cohesion (active material to itself) and the layer separates into islands of conductive polymer. The presence of these islands gives unacceptably non-uniform brightness and can potentially result in breaks in the polymer emitting layer printed on top of them that cause a short circuit between top and bottom electrodes, rendering the lamp non-light emitting.

Adding surfactants to lower the surface tension of aqueous conductive polymer inks leads to greater non-uniformity of the hole injection layer; that is, the islands of conductive polymer tend to be thicker and further apart.

An advantage to using a screen with mesh count less than 305 threads/inch to print aqueous conductive polymer inks is that such screens have higher % open area that reduce the amount of evaporation retarder additive necessary to prevent the ink from drying out on the screen and plugging it. As a general rule, a retarder is needed for any ink with carrier solvent (or in this case liquid dispersant) boiling at less than 150° C. at 1 atmosphere pressure. Such retarders contain polymers that remain in the hole injection layer, reducing the conductive polymer concentration and hence reducing the amount of electric current density the layer can achieve. Higher current density capacity means higher potential lamp brightness.

There is no advantage to printing a thicker hole injection layer than necessary, so aqueous inks more concentrated than 2% can be diluted to allow printing through screens as previously described.

On the other hand, aqueous conductive polymer inks with less than 1% conductive polymer will generally have insufficient viscosity to be supported by the mesh, and will tend to run through the pattern, or "bleed" creating a poorly defined printed image on the transparent conductive surface. Even with polymeric viscosity enhancers, conductive polymer cohesion is so reduced as the hole injection layer dries that we have not found any mesh count or screen capable of printing a uniform hole injection layer.

Hole injection layers printed from aqueous conductive polymer inks dry completely at ambient conditions in at most two minutes. Further removal of adsorbed moisture from the air-dried hole injection layer may be desirable to enhance lamp longevity, and this is possible by use of a vacuum oven or chemical dewetting agents.

If the conductive polymer ink for the hole injection layer is non-aqueous, it is as if a surfactant had been added to an aqueous ink. It has been found that no screen mesh or theoretical ink volume or conductive polymer content in such inks can achieve a uniform layer of conductive polymer less than twice that which can be achieved with aqueous conductive polymer inks. This implies reduced light transmission and thus poorer lamp performance from use of such non-aqueous conductive polymer inks.

Screen Printing the Light-emitting polymer Layer

In the most common embodiment, a forward-build LEP construction, a light-emitting polymer layer is printed on the hole injection layer. A light-emitting polymer consists of a conjugated polymer such as poly(2-methoxy,5-(2'-ethylhexoxy)-1,4-phenylenevinylene) [MEH-PPV] or methyl-substituted ladder-type polyparaphenylene [MeLPPP]. Many other light-emitting polymers are described in the scientific and patent literature.

Many light-emitting polymers are capable of dissolving in organic solvents suitable for screen printing such as xylene and diethylbenzene to concentrations as high as several percent. Such inks are termed "lacquers," having no solids content.

Our process screen prints light-emitting polymer lacquers directly on the hole injection layer using a plain weave polyester cloth with lowest theoretical ink volume commercially available (about 7.5 $cm^3/m^2$). Such cloths typically have mesh counts of 380 threads per inch or higher. By simply multiplying the theoretical ink volume by the dried solids volume fraction in the lacquer a layer thickness can be calculated which is close to that actually achieved.

Screen printable light-emitting polymer lacquers in general have low surface tension and low viscosity, on the order of a few centipoise. Without a viscosity enhancing additive such inks will not remain confined to the open cloth area prior to the squeegee stroke, but "bleed through;" that is, spread out on the bottom cloth surface. If printed, the image is smeared beyond the open pattern areas, resulting in undesired thickness variation: thinner at open pattern area edges, thicker towards the open area center, away from the edges. Thinner areas of light-emitting polymer will be brighter than thicker areas because the current density through a thin area will be greater, and brightness is proportional to current density.

A more serious problem in printing light-emitting polymer lacquers with low viscosity that bleed through the cloth is that during the squeegee stroke the substrate will tend to stick to the lacquer spread out on the bottom cloth surface. At the end of the print stroke when the screen is lifted, it may lift the substrate as well, stuck to the bottom of the screen. This invariably ruins that print and requires frequent cleaning of the bottom surface of the screen cloth to prevent, greatly reducing print production efficiency.

One remedy to increase lacquer viscosity is to dissolve a non-conjugated polymer such as polystyrene with high enough molecular weight so that only 1% (or less) dissolved gives more than 50 centipoise lacquer viscosity, which we have found sufficient to prevent bleed through. However, by increasing the dried solids content in the lacquer, the light-emitting polymer layer thickness will likewise increase, decreasing device brightness. To counter this, the amount of light-emitting polymer in the lacquer can be decreased; however, dilution of the light-emitting polymer in the light emitting layer reduces the amount of electric current density that can be sent through the layer, lowering potential lamp brightness.

An alternative to using non-conjugated polymers to increase lacquer viscosity is the use of camphene [CAS#79-92-5] to replace most of the solvent in the lacquer. Camphene is a waxy solid that melts at 50° C. and boils at 160° C. at 1 atmosphere pressure. Light-emitting polymers readily dissolve in liquid camphene, heated to above 50° C. A small addition of 5–6% by weight of conventional lacquer solvent such as diethylbenzene to heated camphene liquid containing dissolved light-emitting polymer reduces the mixture melting point to just below room temperature, giving a lacquer filled with tiny crystallites of camphene. The presence of the camphene crystallites greatly increases the lacquer viscosity so that it cannot bleed through the screen. The camphene crystallites small enough to pass through the mesh opening during printing readily deform when pressed against the substrate surface so they do not puncture or scratch the hole injection layer. Further, the camphene crystallites have a higher vapor pressure than the drying liquid layer, so they evaporate before the rest of the layer which tends to close any hole left so as to minimize surface energy. Dried, the light-emitting polymer layer consists entirely of light-emitting polymer. Layers 50–150 nm thick can be printed this way, with no breaks visible even at a microscopic level.

The light-emitting polymer layer is so thin that the printed layer dries completely in air at ambient conditions in at most two minutes.

Screen Printing Trace Circuitry

In the most common embodiment, a forward-build LEP construction, conductive traces are screen-printed after the light-emitting polymer layer, to allow electrical current to reach the transparent front electrodes from the electrical source.

Such printed circuit traces are in general not transparent, and have much lower electrical resistance than a transparent electrode. To achieve low electrical resistance they are relatively thick, on the order of 10 microns.

This printing step is not novel, because it is used in thick film inorganic electroluminescent lamp production, for example. Carrying this step out after the light-emitting polymer printing step rather than before avoids a potential shorting problem. This problem may occur when printing the light-emitting polymer layer where the cloth does not contact the substrate immediately adjacent to the circuit trace area, during the squeegee stroke, leaving exposed areas of the hole injection layer. Although an insulating layer is printed on top of the thick conductive traces, it may not cover all the exposed hole injection layer, so that when the top electrode is deposited a short circuit to the exposed hole injection layer can occur and the lamp will fail to emit light.

Deposition of the Top Conductive Electrode

A top conductive electrode is vapor phase deposited onto the light emitting polymer layer through a patterned mask that allows simultaneous deposition of a circuit trace. The electrode is typically aluminum, or magnesium-silver alloy. Calcium is sometimes used as well. It is desirable that the layer reflect light back to the transparent electrode viewing face and that it conduct electric current with resistance equal to or less than that of the transparent front electrode. We recognize the desirability of screen printing this layer as well, but have not found any conductive ink formulation of low work function metal capable of covering the thin light emitting polymer layer without scratching it and creating shorts with the hole injection layer beneath. Traditionally, the conductive top layer is deposited from the vapor phase through a patterned mask. Various techniques (except screen printing) to apply this top electrode are described in the scientific and patent literature.

We also recognize that low work function metal electrodes are easily oxidized, thus may need protection by covering with a suitable low air-permeable barrier such as Saran™ or metallized polyester.

Reverse-build Construction

In this embodiment, a bottom conductive cathode is first vapor phase deposited onto a plastic or other substrate through a patterned mask that allows simultaneous deposition of a circuit trace. The cathode metal is similar to the forward-build embodiment. Alternatively, in place of this step a foil cathode of aluminum could be selected mounted to a substrate so that it is possible to screen print directly onto the foil.

Onto this light-reflective cathode is screen printed a light-emitting polymer layer patterned to entirely cover any conductive cathode surface capable of forming a short circuit with the top electrode. This layer is screen printed the same way as in the forward-build embodiment.

When the light-emitting polymer layer has dried, the hole injection layer is screen printed on it. This hole injection layer is screen printed the same way as in the forward-build embodiment. Typically, the patterned mask this layer is printed through will be the desired lighted image.

When the hole injection layer has dried, a transparent top anode layer is screen printed onto it. This screen printing step is not novel and transparent inks made with indiumtin oxide (for example) are commercially available. However, such transparent electrodes are printed with inks that contain a polymer binder. When dried, the binder adheres to the hole injection layer and certain other areas of the light-emitting polymer layer not covered by the hole injection layer. This layer is relatively thick, typically 10 microns or higher. Even with this thickness, electrical conductivity of such screen printed transparent conductors is less than that of a vapor deposited transparent conductor. Conductivity is boosted by screen printing an additional relatively thick layer of opaque, higher conductivity material through a pattern as channel traces and current distribution busses to the transparent conductive area, so as not to block any emitted light.

We recognize that with this reverse-build construction it is more difficult to screen print additional layers of conventional color filters onto the viewing surface because of the presence of thick conductive traces and that the viewing surface through which the light emits will not be smooth for the same reason.

EXAMPLE

As an example of our process, we will describe the printing of a forward-build light-emitting polymer lamp element, ½ inch×½ inch square.

Figure 3:
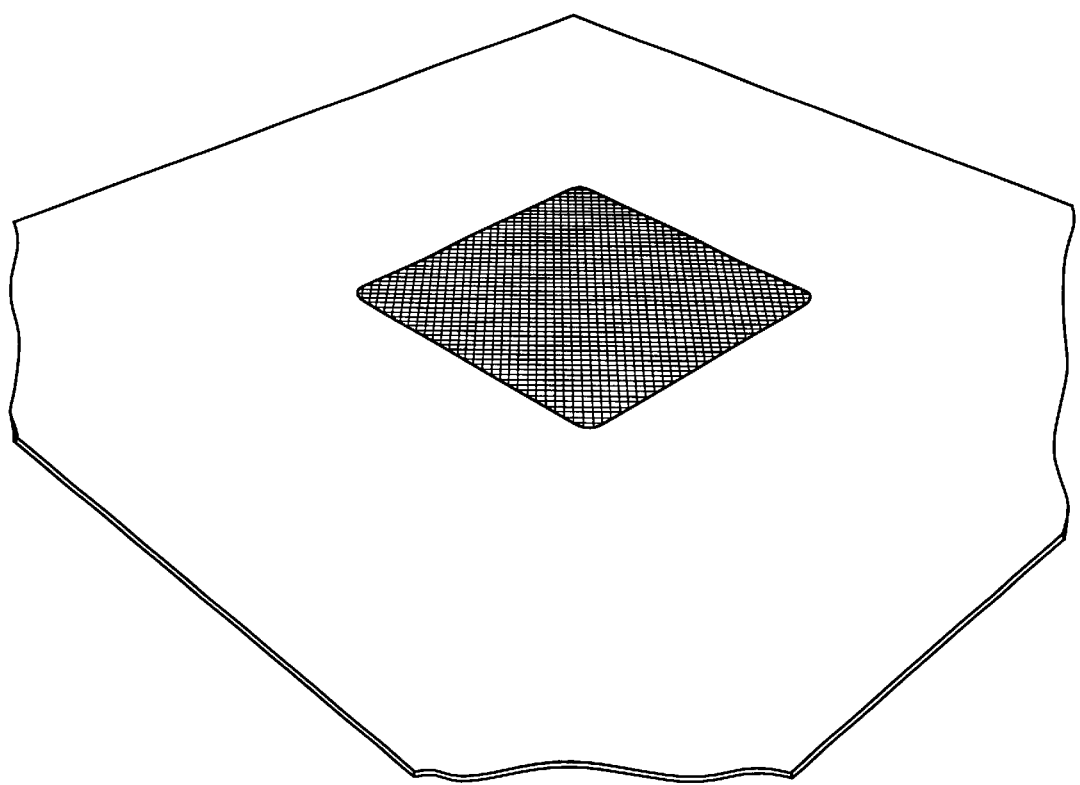
FIG. 3 shows an etch step in one embodiment of the present invention.

As FIG. 3 shows, the first step is to etch away all excess indium tin oxide transparent electrode, commercially available sputtered on $7/1000$ inch thick poly(ethylene terephthalate), heat treated so it won't shrink during subsequent drying steps. The unetched area is a little wider than the light emitting area.

Figure 4:
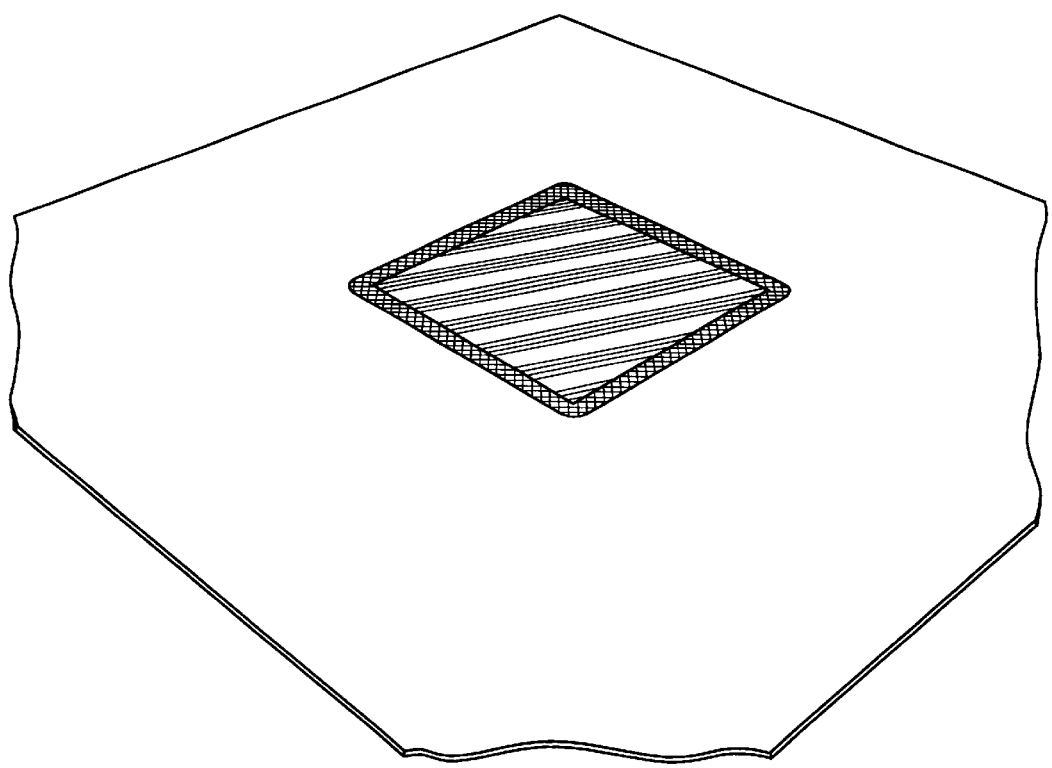
FIG. 4 shows the hole injection layer in one embodiment of the present invention.

In FIG. 4, a 200 nm layer of PEDOT is printed onto the unetched ITO area through a 255 mesh plain weave polyester screen having a theoretical ink volume of 18 cm$^3$/m$^2$. The emulsion used to create the patterned mask is a direct liquid emulsion resistant to water. The ink is Baytron P, commercially available from Bayer, Inc. with 4 weight % Nazdar Aqualube 54 retarder added. The layer dries after several minutes exposed to air. The area printed should coincide with the unetched ITO area.

Figure 5:
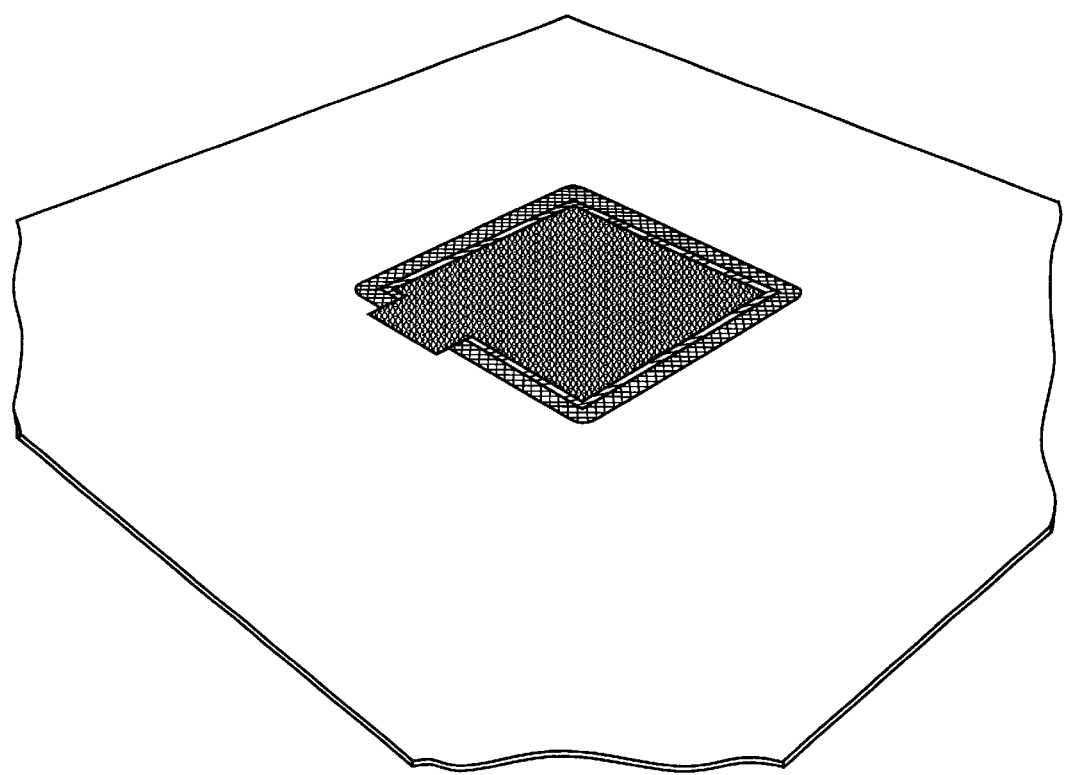
FIG. 5 shows the light emitting polymer layer in one embodiment of the present invention.

In FIG. 5 a 100 nm thick light-emitting polymer layer is printed onto the PEDOT layer through a 460 mesh plain weave polyester screen having a theoretical ink volume of 7.5 microns. The ink is 0.8 weight % MeLPPP in camphene with 4 weight % diethylbenzene added to lower the melting point to just below room temperature. The printed layer dries after several minutes exposed to air. The area printed should be ½ inch×½ inch, slightly less than the PEDOT layer, except for part of one side which covers all the PEDOT layer out to the non-conductive PET substrate left following the etch step in FIG. 3. This overlapping area is necessary to allow a top electrode trace to be deposited, to complete the connection of the light emitting polymer lamp to an electrical source.

Figure 6:
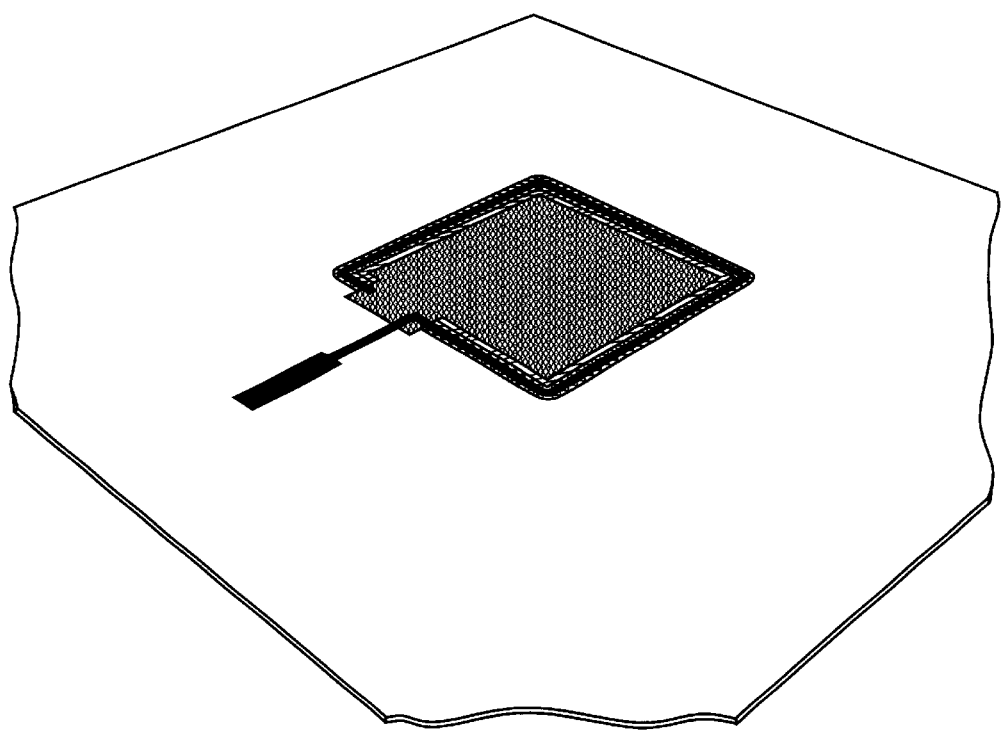
FIG. 6 shows the conductive silver trace printed on hole injection layer in one embodiment of the present invention.

In FIG. 6, a 10 micron thick conductive silver/polymer composite circuit layer is printed through a 230 mesh count plain weave polyester cloth. This circuit trace surrounds the light-emitting polymer except at the overlapping area previously described, and has a straight length leading to the edge of the substrate for convenient connection of an electrical power source. Suitable screen printable silver pastes are commercially available from a number of suppliers: DuPont, Acheson Colloids, Prestige Printing, KIA.

Figure 7:
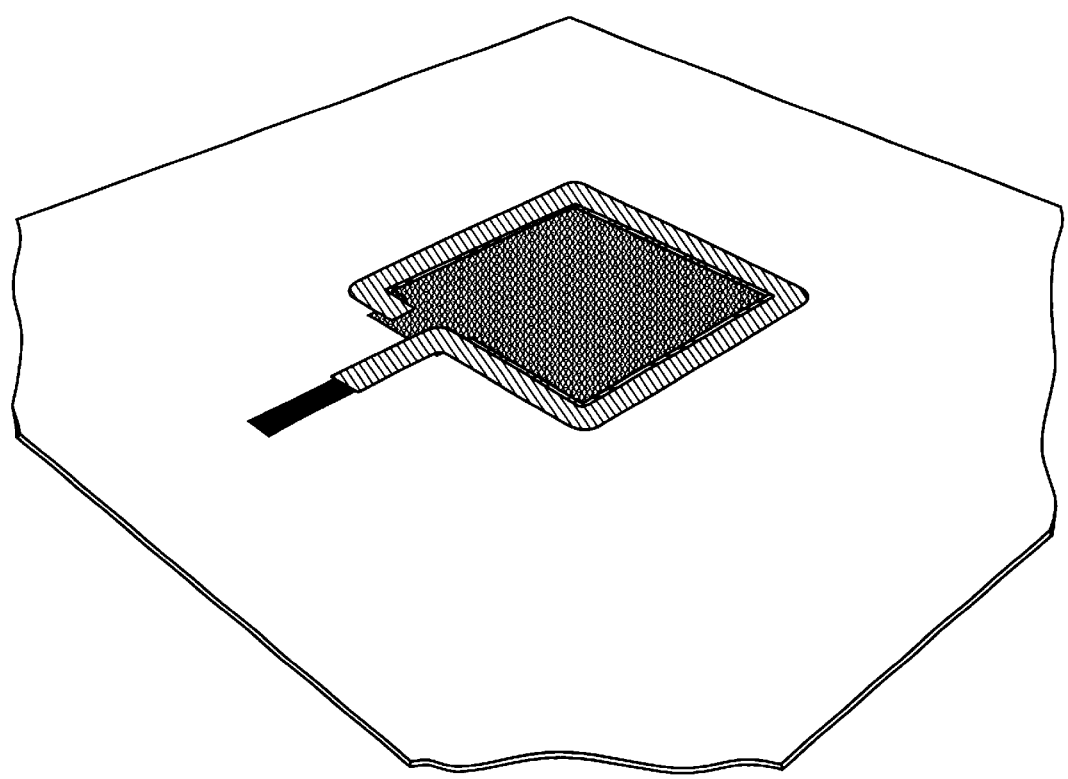
FIG. 7 shows the dielectric insulator printed on conductive silver trace in one embodiment of the present invention.

In FIG. 7, a polymer dielectric a few microns thick is printed over all the conductive silver circuit traces to prevent the possibility of a short circuit, through a 305 mesh count plain weave polyester cloth. This dielectric covers the silver and an area slightly adjacent, so that no conductive surface is left exposed. Suitable dielectric inks are available from a number of suppliers. We use a proprietary vinylidene fluoride-hexafluoropropylene copolymer dissolved in carbitol acetate solvent, but polyester printable dielectric inks are also common.

This example has no electron injection layer, although lithium fluoride 10 Angstroms thick might be deposited by vapor deposition onto the light-emitting polymer layer with some benefit to device performance.

Figure 8:
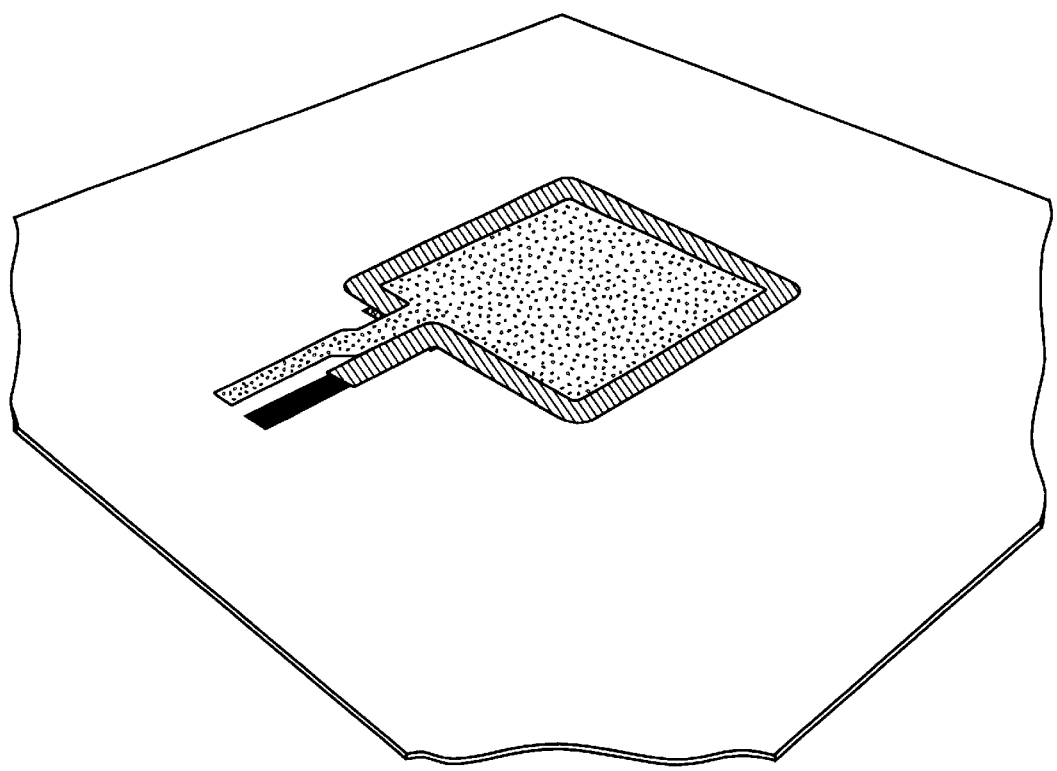
FIG. 8 shows an aluminum top electrode and trace deposited onto a light emitting polymer layer and substrate in one embodiment of the present invention.

In FIG. 8, a continuous aluminum rear electrode and trace is deposited via thermal evaporation through a patterned mask. The aluminum trace runs parallel to the thick silver circuit trace to allow convenient connection of the lamp with an electrical source.

When a DC voltage source is applied with the aluminum trace negative to the silver (that is, the top electrode negative to the transparent front electrode), the lamp will light with a blue emission at 10–12 volts and will reach 100 candelas/$m^2$ at 16 V(DC). Current will be about 10 milliamperes. The lamp gets brighter as voltage increases but cannot withstand more than 30 V(DC) at which point the dielectric strength of the light emitting polymer layer is exceeded allowing current to arc between top and bottom electrode.

Although the present invention has been described with reference to specific limitations and embodiments, the scope of the invention is not intended to be limited to these and is limited only by the scope of the appended claims.

We claim:

1. A process for manufacturing a light emitting polymer device, comprising:
   providing a transparent electrode-containing substrate. adapted to act as a first electrode;
   providing a hole transport layer over the transparent electrode-containing substrate;
   screen printing a light emitting polymer layer over the hole transport layer;
   depositing a second electrode over the light emitting polymer layer; and
   screen printing a conductive trace over the light-emitting polymer layer.

2. The process described in claim 1 wherein the step of providing the hole transport layer comprises screen printing the hole transport layer.

3. The process described in claim 1, wherein:
   the second electrode is composed of low work function metal; and
   the second electrode is deposited over the light-emitting polymer layer from the vapor phase through a patterned mask.

4. The process described in claim 1, further comprising screen printing a dielectric insulating layer over the conductive trace.

5. The process described in claim 2 wherein the step of screen printing the light emitting polymer layer includes using a screen with a mesh count of less than 460 threads/inch.

6. The process described in claim 5 wherein the screen is made of one of polyester, nylon and metal.

7. The process described in claim 5 wherein the screen is made of a plain weave.

8. The process described in claim 5 wherein the screen is made of a twill weave.

9. The process described in claim 2 wherein the step of screen printing the light emitting polymer layer includes using a screen with a theoretical ink volume greater than 7.5 microns.

10. The process described in claim 2 wherein the step of screen printing the light emitting polymer layer includes the step of applying a squeegee to a screen to spread a liquid form of the light emitting polymer over the screen in a manner that prevents bleed through of the liquid form of the light emitting polymer.

11. A process for manufacturing a light emitting polymer device, comprising:
    providing a transparent electrode-containing substrate, adapted to act as a first electrode;
    providing a hole transport layer over the transparent electrode-containing substrate;
    screen printing a light emitting polymer layer over the hole transport layer;
    depositing a second electrode over the light emitting polymer layer: and
    depositing an electron transport layer over the light-emitting polymer layer.

12. The process described in claim 11, wherein the electron transport layer is deposited over the light-emitting polymer layer from the vapor phase through a patterned mask.

13. The process described in claim 12, further comprising depositing a second electrode onto the electron injection layer.

14. The process described in claim 13, wherein:
    the second electrode is composed of low work function metal; and
    the second electrode is deposited onto the electron injection layer from the vapor phase through a patterned mask.

15. The process described in claim 11 wherein the step of providing the hole transport layer comprises screen printing the hole transport layer.

16. The process described in claim 11, wherein:
    the second electrode is composed of low work function metal; and
    the second electrode is deposited over the light-emitting polymer layer from the vapor phase through a patterned mask.

17. The process described in claim 15 wherein the step of screen printing the light emitting polymer layer includes using a screen with a mesh count of less than 460 threads/inch.

18. The process described in claim 15 wherein the step of screen printing the light emitting polymer layer includes using a screen with a theoretical ink volume greater than 7.5 microns.

19. The process described in claim 15 wherein the step of screen printing the light emitting polymer layer includes the step of applying a squeegee to a screen to spread a liquid form of the light emitting polymer over the screen in a manner that prevents bleed through of the liquid form of the light emitting polymer.

20. A process for manufacturing a light emittng polymer device, comprising:
providing a transparent electrode-containing substrate, adapted to act as a first electrode;
providing a hole transport layer over the transparent electrode-containing substrate; and
screen printing a light emitting polymer layer over the hole transport layer,
wherein the light emitting polymer layer is screen printed as a light emitting polymer dissolved in a solvent.
wherein the solvent is a mixture of solvents, and
wherein one of the solvents is camphene.

21. A process for manufacturing a light emitting polymer device, comprising:
sequentially forming a plurality of layers to obtain the light emitting polymer device,
wherein one of the layers is a light emitting polymer layer that is screen printed onto another one of the plurality of layers,
wherein the light emitting polymer layer is screen printed as a light emitting polymer dissolved in a solvent,
wherein the solvent is a mixture of solvents, and
wherein one of the solvents is camphene.

22. The process described in claim 21 wherein the step of sequentially forming further includes forming a first electrode, a hole transport layer, and a second electrode, and wherein the light emitting polymer layer is formed after the formation of the hole transport layer and before the formation of the second electrode.

23. The process described in claim 21 wherein the step of screen printing the light emitting polymer layer includes using a screen with a mesh count of less than 460 threads/inch.

24. The process described in claim 23 wherein the screen is made of polyester.

25. The process described in claim 23 wherein the screen is made of nylon.

26. The process described in claim 23 wherein the screen is made of metal.

27. The process described in claim 23 wherein the screen is made of a plain weave.

28. The process described in claim 23 wherein the screen is made of a twill weave.

29. The process described in claim 21 wherein the step of screen printing the light emitting polymer layer includes using a screen made of polyester.

30. The process described in claim 21 wherein the step of screen printing the light emitting polymer layer includes using a screen made of nylon.

31. The process described in claim 21 wherein the step of screen printing the light emitting polymer layer includes using a screen made of metal.

32. The process described in claim 21 wherein the step of screen printing the light emitting polymer layer includes using a screen made of a plain weave.

33. The process described in claim 21 wherein the step of screen printing the light emitting polymer layer includes using a screen made of a twill weave.

34. The process described in claim 21 wherein the step of screen printing the light emitting polymer layer includes using a screen with a theoretical ink volume greater than 7.5 microns.

35. The process described in claim 21 wherein the step of screen printing the light emitting polymer layer includes the step of applying a squeegee to a screen to spread a liquid form of the light emitting polymer over the screen in a manner that prevents bleed through of the liquid form of the light emitting polymer.

36. The process described in 20 wherein the hole transport layer is a conducting polymer.

37. A process for manufacturing a light emitting polymer device, comprising:
sequentially forming a plurality of layers to obtain the light emitting polymer device,
wherein one of the layers is a light emitting polymer layer that is screen printed onto another one of the plurality of layers, and
wherein the step of screen printing the light emitting polymer layer applies a light emitting polymer that includes a conjugated polymer.

38. The process described in claim 37 wherein the light emitting polymer includes a viscosity enhancing additive.

39. The process described in claim 38 wherein the viscosity enhancing additive is a non-conjugated polymer.

40. The process described in claim 37 wherein the step of sequentially forming further includes forming a first electrode, a hole transport layer, and a second electrode, and wherein the light emitting polymer layer is formed after the formation of the hole transport layer and before the formation of the second electrode.

41. The process described in claim 37 wherein the step of screen printing the light emitting polymer layer includes using a screen with a mesh count of less than 460 threads/inch.

42. The process described in claim 37 wherein the step of screen printing the light emitting polymer layer includes using a screen made of polyester.

43. The process described in claim 37 wherein the step of screen printing the light emitting polymer layer includes using a screen made of nylon.

44. The process described in claim 37 wherein the step of screen printing the light emitting polymer layer includes using a screen made of metal.

45. The process described in claim 37 wherein the step of screen printing the light emitting polymer layer includes using a screen made of a plain weave.

46. A process for manufacturing a light emitting polymer device, comprising:
providing a transparent electrode-containing substrate, adapted to act as a first electrode;
providing a hole transport layer over the transparent electrode-containing substate;
screen printing a light emitting polymer layer over the hole transport layer; and
depositing a second electrode over the light emitting polymer layer,
wherein the step of providing the hole transport layer comprises screen printing the hole transport layer, and
wherein the step of screen printing the light emitting polymer layer applies a light emitting polymer that includes a conjugated polymer.

47. The process described in claim 46 wherein the light emitting polymer includes a viscosity enhancing additive.

48. The process described in claim 47 wherein the viscosity enhancing additive is a non-conjugated polymer.

49. The process described in claim 37 wherein the step of screen printing the light emitting polymer layer includes using a screen made of a twill weave.

50. The process described in claim 37 wherein the step of screen printing the light emitting polymer layer includes using a screen with a theoretical ink volume greater than 7.5 microns.

51. The process described in claim 37 wherein the step of screen printing the light emitting polymer layer includes the step of applying a squeegee to a screen to spread a liquid form of the light emitting polymer over the screen in a manner that prevents bleed through of the liquid form of the light emitting polymer.

* * * * *